(12) United States Patent
Eldridge (10) Patent No.: US 8,896,336 B2
(45) Date of Patent: Nov. 25, 2014

(54) TESTING TECHNIQUES FOR THROUGH-DEVICE VIAS

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 207 days.

(21) Appl. No.: 13/172,001

(22) Filed: Jun. 29, 2011

(65) Prior Publication Data

US 2012/0007626 A1    Jan. 12, 2012

Related U.S. Application Data

(60) Provisional application No. 61/361,800, filed on Jul. 6, 2010.

(51) Int. Cl.
| | | |
|---|---|---|
| *G01R 31/00* | (2006.01) | |
| *G01R 31/26* | (2014.01) | |
| *G01R 31/02* | (2006.01) | |
| *G01R 31/28* | (2006.01) | |

(52) U.S. Cl.
CPC ........ *G01R 31/2884* (2013.01); *G01R 31/2889* (2013.01)
USPC .................. 324/756.03; 324/537; 324/762.01

(58) Field of Classification Search
CPC ........................ G01R 31/2889; G01R 31/2884
USPC ............................... 324/756.03, 762.01, 537
See application file for complete search history.

(56) References Cited

U.S. PATENT DOCUMENTS

| | | | | |
|---|---|---|---|---|
| 7,598,523 | B2 | 10/2009 | Luo | |
| 8,471,577 | B2 * | 6/2013 | Stillman et al. | 324/754.01 |
| 2003/0080408 | A1 * | 5/2003 | Farnworth et al. | 257/698 |
| 2004/0201392 | A1 * | 10/2004 | Kim et al. | 324/758 |
| 2006/0094162 | A1 | 5/2006 | Yabushita et al. | |
| 2007/0046303 | A1 | 3/2007 | Kim et al. | |
| 2007/0063721 | A1 * | 3/2007 | Dozier et al. | 324/754 |
| 2007/0126440 | A1 * | 6/2007 | Hobbs et al. | 324/754 |
| 2007/0126443 | A1 * | 6/2007 | Grube et al. | 324/754 |
| 2007/0257696 | A1 * | 11/2007 | Eldridge et al. | 324/765 |

(Continued)

FOREIGN PATENT DOCUMENTS

| | | |
|---|---|---|
| JP | 07-083953 | 3/1995 |
| JP | 11-160356 | 6/1999 |

OTHER PUBLICATIONS

Lefever, "Through Silicon Via Testing," 5th Annual SEMATECH/ISMI Symposium, Sep. 15-17, 2009, Tokyo, Japan (13 pages).

(Continued)

*Primary Examiner* — Jermele M Hollington
(74) *Attorney, Agent, or Firm* — Kirton | McConkie (57) ABSTRACT

Techniques for testing an electronic device with through-device vias can include using a probe card assembly with probes for contacting connection structures of the electronic device including ends of through-device vias of the electronic device. A pair of the probes can be electrically connected in the probe card assembly and can thus contact and form a direct return loop from one through-device via to another through-device via of a pair of the through-device vias with which the pair of probes is in contact. The electronic device can include test circuitry for driving a test signal onto the one of the through-device vias and a receiver for detecting the test signal on the other of the through-device vias.

23 Claims, 3 Drawing Sheets

(56) References Cited

U.S. PATENT DOCUMENTS

| | | | |
|---|---|---|---|
| 2008/0018350 A1* | 1/2008 | Chao et al. | 324/754 |
| 2008/0272372 A1* | 11/2008 | Luo et al. | 257/48 |
| 2013/0120018 A1* | 5/2013 | Hou et al. | 324/762.01 |
| 2013/0200910 A1* | 8/2013 | Ellis-Monaghan et al. | 324/755.01 |
| 2013/0297981 A1* | 11/2013 | Gu et al. | 714/727 |

OTHER PUBLICATIONS

International Search Report and Written Opinion of the International Searching Authority, PCT/US2011/042850, Feb. 27, 2012 (8 pages).

* cited by examiner

TESTING TECHNIQUES FOR THROUGH-DEVICE VIAS

BACKGROUND

Through-silicon vias are being used in multiple die assemblies. A through-silicon via is an electrical connection that passes through the silicon substrate of a die; these can also be known as through-device vias because the electrical connection passes through the device. Through-silicon vias can be used to provide electrical connections between dies, for example, in a stacked die assembly, augmenting or replacing edge wiring. A through-silicon via can be a pass through via (e.g., providing connection through a first die to allow two second dies disposed on either side of the first die to be connected to each other). A through-silicon via can also provide a connection to circuitry on the device. Sometimes, a through-silicon via connects to internal circuitry of the device, yet does not include typical circuitry provided in an input/output cell of an integrated circuit (e.g., when the through-silicon via is to connect to internal circuitry of another die). Through-silicon vias can be of various configurations, a common configuration being that of a vertical connection through the device.

Through-silicon vias can present a number of testing challenges. For example, dies can include very high numbers of through-silicon vias which exceed the available pin counts for testers. Another difficulty can be presented by through-silicon vias which are connected to internal nodes of a die. Signals can be incompatible with a tester (e.g., due to different drive levels) or the internal node can be extremely sensitive to electrostatic discharge (e.g., when no protection circuit is included in the die).

SUMMARY

In some embodiments, an electronic device with through-device vias can be tested by bringing electrically conductive probes of a probe card assembly into contact with a first electronic device to make electrical connections between the probe card assembly and the first electronic device through the probes. A set of the probes can be electrically connected to each other within the probe card assembly and can be brought into contact with a set of through-device vias of the first electronic device. A test signal can then be provided from within the first electronic device to a first through-device via in the set, and it can be determined whether the test signal is present on a second through-device via in the set.

In some embodiments, probes can be disposed on the substrate of a probe card assembly. The probes can be arranged to contact connection structures including ends of through-device vias of an electronic device. A first electrical connection can electrically connect a first pair of the probes. Those probes can form a direct return loop from one of the through-device vias to another of the through-device vias while the first probe is in contact with the through-device vias.

In some embodiments, an electronic device can have through-device vias. A driver circuit can be coupled to one of the through-device vias, and a receiver circuit can be coupled to another of the through-device vias. The electronic device can also include a test circuit coupled to the driver circuit and the first receiver circuit. The test circuit can be configured to cause the driver circuit to drive a test signal onto the one through-device via and can then determine whether the test signal is received at the first receiver from the other through-device via.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
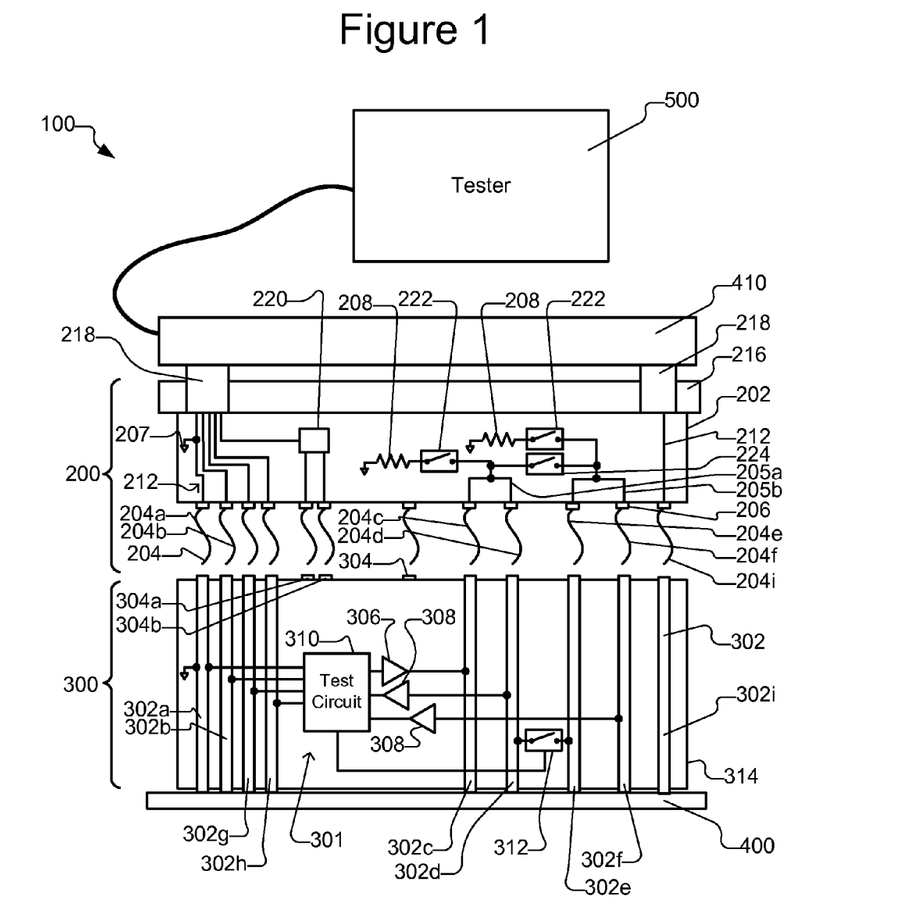
FIG. 1 is a block diagram of a testing system in accordance with some embodiments of the invention.

FIG. 1 illustrates a testing system 100 which can be used to test electronic devices 300 having through-device vias 302. The testing system 100 can include a probe card assembly 200. The probe card assembly 200 can include a substrate 202 on which a plurality of probes 204 are disposed. The substrate 202 can be a rigid material, including for example rigid materials such as ceramic and semi-rigid materials such as glass-epoxy, and can be coupled to a stiffener 216. For example, the stiffener 216 can be a rigid material (such as aluminum or other metal) bolted, adhered, or otherwise attached to a circuit board (not shown). The stiffener 216 can include open portions or cavities to allow electrical connections to pass through the stiffener 216 or provide space for circuitry or components of the probe card assembly 200. The probes 204 can be, for example, disposed on terminals 206 (e.g., conductive pads) of the substrate 202. The probes 204 can be resilient probes, including for example, spring probes, micro-machined probes, lithographically formed probes, cantilevered beam probes, and the like.

The probe card assembly 200 can include a tester interface 218 (e.g., an electrical interface). For example, the tester interface can be connectors (e.g., zero-insertion-force connectors) which allow for connection through a probe head 410 to a tester 500 or other circuitry used to provide to and receive from the probes 204 signals, power, and/or the like. The tester interface 218 can also supply power to the probe card assembly 200 (and to the electronic device 300, e.g., through electrical connections within the probe card assembly and via probes 204). For example, the tester 500 can be interfaced through a probe head 410 portion of a prober. The probe card assembly 200 can be installed (e.g., bolted) to the probe head 410.

The testing system 100 can be used to test an electronic device 300. For example, the electronic device 300 can be a die, a die stack, a wafer, a semiconductor device, or the like. As a particular example, the electronic device 300 can comprise a semiconductor (e.g., silicon) substrate 314 into which is integrated an electric circuit (not shown) as is known in the field. For example, the electric circuit (not shown) can comprise memory circuits, a microprocessor, signal processing circuitry, or the like. The electronic device 300 can also include one or more through-device vias 302, which can extend from one side (or surface) of the device 300 to an opposite side (or surface) as shown in FIG. 1. For example, the through-device vias can be through-silicon vias that extend from one side (or surface) of the semiconductor substrate 314 to an opposite side (or surface). The electronic device 300 can also include contact structure 304 (e.g., electrically conductive terminals, pads, or the like) that are not through-device vias but which can provide input and/or output connections to circuitry (not shown) of the device 300. Although the through device vias 302 are illustrated as purely vertical connections, they need not be.

As mentioned above, it can be difficult to test electronic devices 300 having through-device vias 302 due to various factors. For example, the density of the through-device vias 302 per unit area, the number of through-devices vias 302 on a given device 300 or collections of devices 300 (as such might be found when the devices 300 are being tested in parallel or in wafer form) can be difficult to accommodate when using a single probe card assembly 200 due to limited number of connections of the tester interface 218 or limited number of resources (communications channels) available from a given tester 500. One common type of fault that might occur during fabrication of a through-device via 302 could be "opens," that is, the through-device via 302 does not provide a connection from one side of the device 300 to the other because of an open circuit along the path of the via 302 from one side of the device 300 to the other side. In some embodiments of the invention, design for test circuitry 301 (e.g. test circuit 310, drivers 306, receivers 308, switches 312, and/or the like) can be added to the device 300 to enable testing for through-device via 302 integrity along the entire length of the via 302. For example, as illustrated, a driver 306 (e.g., a first, second, etc. driver) can be connected to a through-device via 302c (e.g., a first, second, etc. through-device via) and configured to drive a test signal onto that through-device via 302c. As another example, a receiver 308 (e.g., a first, second, etc. receiver) can be connected to a through-device via 302d and configured to receive (or detect) a test signal on that through-device via 302d. As yet another example, switch 312 can selectively connect and disconnect through-device vias (e.g., 302d and 302e in FIG. 1) to and from each other. Test circuit 310 can control the driver(s) 306, receiver(s) 308, and/or switches 312.

The electronic device 300 shown in FIG. 1 is an example only, and many variations are possible. For example, although one driver 306, two receivers 308, and one switch 312 each connected to one or more of four through-device vias 302a, 302b, 302c, and 302d are shown, there can be more or fewer of each. As another example, test circuitry 301 can comprise additional circuit elements, and/or test circuitry 301 need not include all of the circuit elements shown in FIG. 1. For example, test circuitry 301 need not include switch(es) 312.

In some embodiments, the design for test circuitry 301 can be used with a probe card assembly 200 having complimentary circuitry to enable one or more loop paths for testing through-device vias 302. Examples of such loop paths are shown in FIG. 1. As shown, the probe card assembly 200 can include electrical connections 205 (e.g., a first, second, etc. connection) each of which can electrically connect two (e.g., a pair) or more of the probes 204. For example, electrical connection 205a can electrical connect a pair of probes 204c and 204d that can contact a pair of through-device vias 302c and 302d. The probes 204c and 204d and the electrical connection 205a can thus provide an electrically conductive loop path from through-device via 302c to through-device via 302d, and a test signal driven by driver 306 onto through-device via 302c can thus loop to through-device via 302d, where the test signal can be detected by a receiver 308 connected to the through-device via 302d. If the test signal is not detected on the through-device via 302d, there is likely a fault (e.g., a defect) in through-device via 302c or 302d.

As another example, electrical connection 205b can electrically connect a pair of probes 204e and 204f that can contact a pair of through-device vias 302e and 302f. The probes 204e and 204f and the electrical connection 205b can thus provide an electrically conductive loop path from through-device via 302e to through-device via 302f. Although not shown, a driver 306 can also be connected to and thus drive a test signal onto through-device via 302e. That test signal can loop to through-device via 302f, where the test signal can be detected by a receiver 308 connected to the through-device via 302f. If the test signal is not detected on the through-device via 302f, there is likely a fault (e.g., a defect) in through-device via 302e or 302f.

Alternatively, the design for test circuitry 301 and the complimentary circuitry on the probe card assembly 200 can connect such loop paths in a daisy chain. For example, switch 312 in the electronic device 200 can be selectively closed to connect electrically through-device vias 302d and 302e. A test signal driven by driver 306 onto through-device via 302c can travel through probes 204c and 204d and electrical connection 205a to through-device via 302d as described above. The test signal can also travel from the probe pair 204c/204d, through-device via pair 302c/302d through the closed switch 312 to the probe pair 204e/204f, through-device via pair 302e/302f due to the daisy chain connection provided by switch 312. Alternatively, switch 224 in the probe card assembly 200 can provide the daisy chain connection rather than (or in addition to) switch 312. Many such probe/through device pairs can be connected with multiple switches 312 and/or 224.

As should be apparent, there need not be direct electrical connections from electrical connections 205 (e.g., 205a and 205b)—and thus the corresponding probes 204 (e.g., 204c-f)—to the electrical interface 218.

As also shown in FIG. 1, the probe card assembly 200 can also include electrical connections 212 from electrical interface 218 to one or more of the probes 204. The tester 500 can thus communicate test, control, data, and/or other such signals and/or power to and from the electronic device 300 through the electrical connections 218 and ones of the probes 204. As also shown, the probe card assembly 200 can include circuitry 220 that is connected to one or more of the probes 204 and/or to the electrical interface 218. Such circuitry 220 can be circuitry for use in testing the electronic device 300. For example, circuitry 220 can be configured to generate, receive, analyze, collect, etc. test, control, data, and/or other such signals for testing the electronic device 300.

Figure 2:
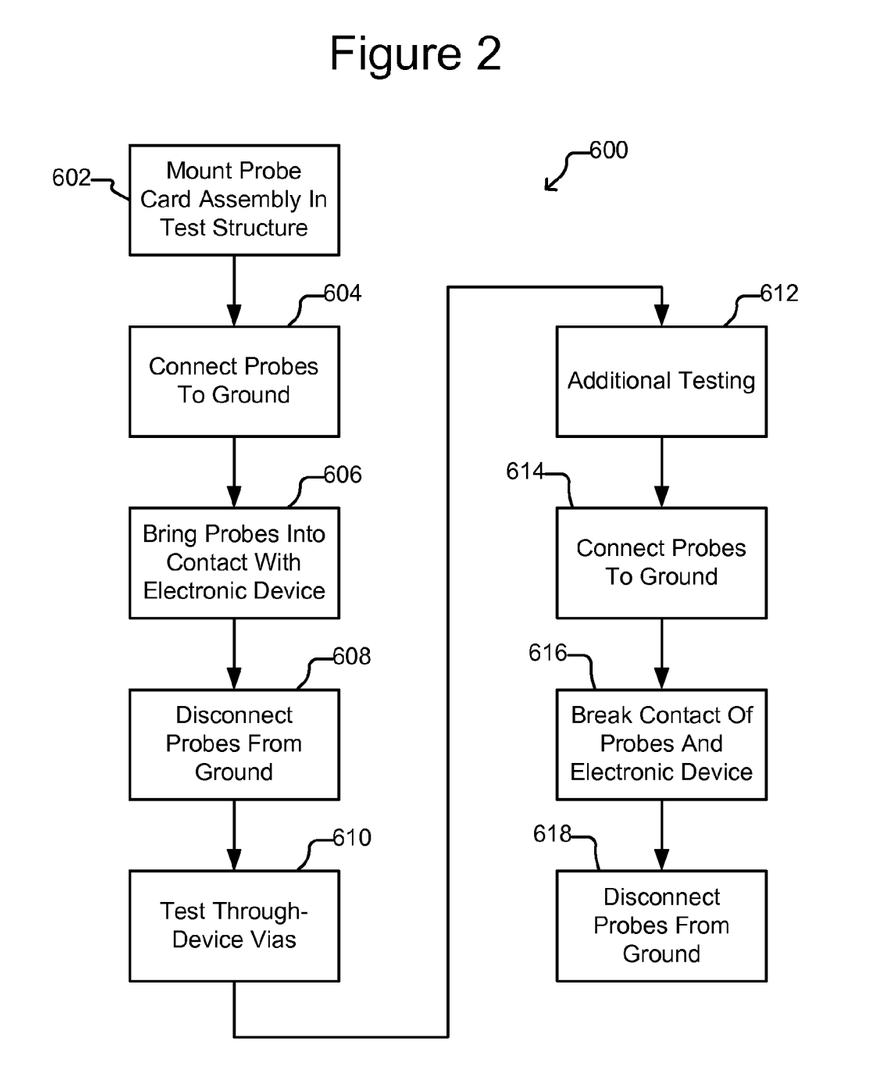
FIG. 2 illustrates a method for testing in accordance with some embodiments of the invention.

FIG. 2 illustrates an example of a method 600 for testing through-device vias (e.g. 302) in an electronic device (e.g., 300). For ease of discussion and illustration, method 600 is discussed below with respect to testing through-device vias 302 in the electronic device 300 using the probe card assembly 200 shown in FIG. 1, but method 600 is not so limited.

The probe card assembly 200 can be provided to the test system 100. For example, the probe card assembly 200 can be installed (e.g., mounted, bolted, clamped, or the like) into the housing or other structure of a testing device such as a prober (not shown) at step 602. The probe card assembly 200 can be interfaced to a tester 500. Alternatively, or in addition, the probe card assembly 200 can include circuitry 220 as discussed above for generating test signals and receiving response signals. As shown in FIG. 1, the electronic device 300 can be positioned on a support 400, such as for example, a stage of a prober.

At step 604, one or more of the probes 204 of the probe card assembly 200 can be connected to ground 207 or other common voltage potential. For example, as generally discussed above, the probe card assembly 200 can include a resistive connection between the electrical connection 205 and ground 207. For example, a resistor 208 can connect the electrical connection to ground 207 (which can, for example, be provided by a terminal of the electrical interface 218 or another ground reference, including for example a ground connection on the electronic device 300 connected through a contact structure 304 and a probe 204). This resistor 208 can help to dissipate electrostatic buildup which might damage the electronic device 300. In some embodiments the resistor 208 can be in the range of a few hundred Ohms to a few hundred Mega-ohms. For example, in some embodiments the resistor can be approximately 1 Kilo-ohm. In some embodiments, a switch 222 can be provided between the electrical connection 205 and the resistor 208 (or, alternatively, between the resistor 208 and the terminal of the tester interface 218). The switch 222 can be controlled either by the tester 500 (e.g., through the tester interface 218) or by the circuitry 220. For example, the switch 222 can be closed to enable the connection to ground 207.

At step 606 of FIG. 2, the probe card assembly 200 can be brought into contact with the electronic device 300. Ones (one or more) of the probes 204 can thus make contact with one or more through-device vias 302 and/or contact structures 304 of the electronic device 300. For example, probes 204 can contact ends of corresponding ones of the through-device vias 302 and/or contact structures 304 to form temporary pressure-based electrical connections therewith. It should be appreciated that not every probe 204 need necessarily contact a through-device via 302 or contact structure 304, nor need every through-device via 302 or contact structure 304 necessarily be contacted by a probe 204.

At step 608, the probes 204 connected to ground 207 at step 604 can be disconnected from ground 207. For example, switches 222 in FIG. 1 can be opened, disconnecting probes 204c-f from ground 207.

At step 610, some or all of the through-device vias 302 can be tested, and at step 612, other testing of the electronic device 300 can be performed. Such testing (step 610 and/or step 612) can be initiated by providing signals through the probes 204 to the electronic device 300. For example, signals can be generated by the circuitry 220 or generated by the tester 500, and passed through the probe card assembly 200 to the electronic device 300. Signals can be provided by individual single signal lines through the tester interface 218, which are electrically connected to probes 204 through the probe card assembly 200, and thus provide the signals to through-device vias 302 and/or contact structures 304 of the electronic device 300. As another example, multiple signals can be provided through a single signal line in a multiplexed format. Groups of signal lines can form a bus. The tester 500 can also provide power to the electronic device 300 through the probe card assembly 200. For example, power connections from the tester interface 218 (or other interfaces on the probe card assembly 200) can connect to probes 204 (e.g. 204a, 204b) which connect to power contact through-device vias 302 (e.g., vias 302a, 302b) of the electronic device 300. As another example, a contact structure 304 can be for ground (e.g., via 304a) and another contact structure 304 can be for power (e.g., via 304b).

Generally in accordance with the discussion above, through-device vias 302 in the electronic device 300 can be tested at step 610 by circuitry that includes the test circuit 310 of the electronic device 400, which can generate an output (e.g., test) signal. For example, the test circuit 310 can generate the output signal in response to an initiation signal provided through the probe card assembly (e.g., from the tester 500 or circuitry 220). For example, the test circuit 310 can provide the output signal through a driver 306 to a first one 302c of the through-device vias. The test circuit 310 is illustrated schematically in FIG. 1. In some embodiments the actual test circuit 310 components can reside near or at the upper surface of the device 300 as might be expected in a device formed using a series of lithographic steps. The test circuitry 310 can, in conjunction with the probe card assembly 200, be used to test through-device vias 302 without requiring a large number of tester channels (e.g., individual connections between the tester 500 and the tester interface 218 of the probe card assembly 200) and report results back to the tester 500 as will now be explained.

Figure 3:
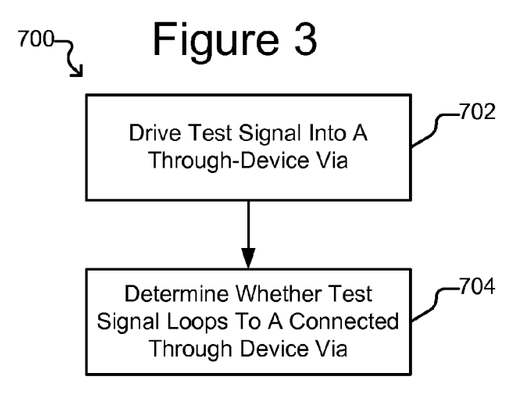
FIG. 3 illustrates an example of the step in FIG. 2 of testing through-device vias according to some embodiments of the invention.
Figure 4:
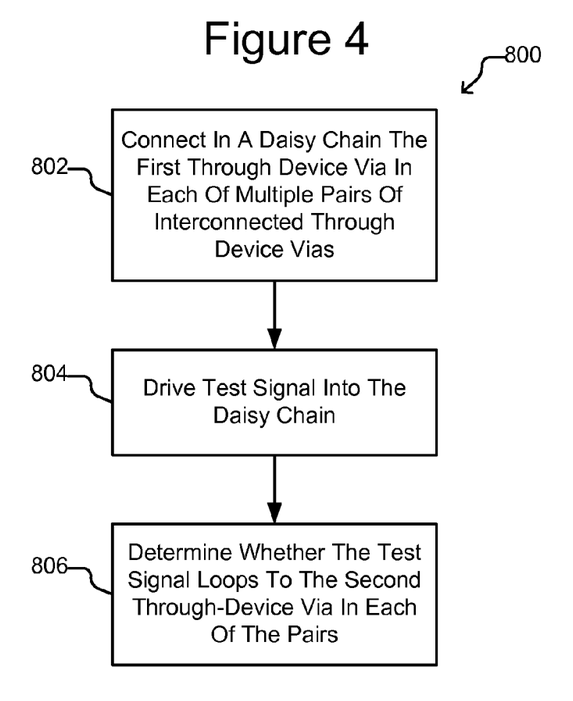
FIG. 4 illustrates another example of the step in FIG. 2 of testing through-device vias according to some embodiments of the invention.

FIGS. 3 and 4 each illustrate an example of a method 700 and 800 that can test through-device vias 302 in the electronic device 300. The methods 700 and 800 are thus two examples of methods for implementing step 610 of FIG. 2.

Referring first to the method 700 of FIG. 3, as discussed above, the probe card assembly 200 can include an electrical connection 205a between a first one 204c of the probes and a second one 204d of the probes. The electrical connection 205a can thus provide an electrical connection allowing the output signal from the driver 306 provided at step 702 of FIG. 3 to pass through a first through-device via 302c, through the first probe 204c, through the electrical connection 205a to the second probe 204d, and to a second through-device via 302d to provide an input signal to the test circuit 310. The input signal can, for example, be provided by a receiver 308 coupled between the second through-device via 302d and the test circuit 310. The test circuit 310 can verify at step 704 if a connection between the first through-device via 302c and the second through-device via 302d is made, for example, by comparing the output signal and the input signal to determine at step 704 whether the test signal driven into the through-device via 302c at step 702 passed to the through-device 302d. The test circuit 310 can thus help to determine if electrical connection is present between the driver 306 and first through-device via 302c, and between the receiver 308 and the second through-device via 302d.

As mentioned, FIG. 4 illustrates an alternative process 800 for implementing step 610 of FIG. 2. As also discussed above, if desired, multiple connections can be daisy chained together to allow testing of multiple through-device vias 302 simultaneously. For example, a test loop can be formed which interconnects probes 204c, 204d, 204e and 204f using electrical connections in the probe card 200 and a switch 312 on the electronic device 300. For example, the switch 312 can be closed at step 802 to connect the through-device vias together for testing as discussed above, and then opened for normal operation of the device. Alternatively, the switch 312 can be disposed on the probe card assembly (e.g., switch 224) and controlled from the test circuit 310, the circuitry 220, and/or the tester 500 to provide the same function. Multiple probes 204 (and hence through-device vias) can be connected together in such a manner through a daisy chain to link the through-device vias together for testing. Thus, through-device vias 302a, 302b, 302d and 302e can be simultaneously tested. The circuit 310 can test a large number of loop paths through the probe card assembly 200 in a manner similar to that just described, providing verification of multiple drivers, receivers, and electrical connections to through-device vias within the electronic device 300.

For example, test circuit 310 can cause driver 306 to output signal (e.g., a test signal) to through-device via 302c at step 804, and at step 806, test circuit 310 can read an input signal from receivers 308 and determine whether the input signals from receivers 308 are the same as the output signal (e.g., the test signal). If the through-device vias 302c-f are free of faults (e.g., defects), the output signal from driver 306 propagates as discussed above through the daisy-chain connected corresponding pairs of probes 204c-f and through-device vias 302c-f and will thus be received at receivers 308 from through-device vias 302d and 302f.

One benefit of the foregoing testing approaches is that fewer test channels (e.g., individual connections between the tester 500 and the probe card assembly 200) may be used when testing a device with many through-device vias. The test circuit 310 can perform the testing on a large number of through-device vias, and then provide detailed or summarized test results over a small number of signal lines (e.g., the test channels referred to above, probes 204, and/or the like). For example, clock and data signals can be provided by through-device vias 302g, 302h back to the probe card assembly 200 and to the tester interface 218. For example, data can be encoded serially, thus allowing test results covering a large number of interconnections to be sent back to the tester using a small number (e.g., two) signal lines. Thus, individual electrical connections from each of probes 204c, 204d, 204e, and 204f back to the tester 500 are not needed. This can help to avoid needing a high pin count tester to fully test electronic devices 300 with through-device vias. As another example, a device which has thousands of through-device vias may have these connections bussed together by electrical connections on the probe card assembly to create a bus of 16, 32 or 64 bit width. Thus, testing the thousands of through-device vias can be performed using a relatively small number of tester channels.

An additional benefit is that the drive capacity required for the drivers on the electronic device 300 can be smaller than that which would be required to drive a probe card assembly in a conventional testing arrangement. For example, in a conventional testing arrangement, signals from a device under test are passed through the probe card assembly to the tester, typically through multiple electrical paths in a coaxial cable. The drivers on an electronic device 300 which drive signals only internally within the die or die stack are typically too weak to drive such a long coaxial cable. Accordingly, using the probe card assembly 200 for testing of an electronic device 300 can allow for testing of signals that are input or output from a through-device via 302 without requiring the size of the drivers 306 to be increased. In contrast, conventional testing arrangements use additional device space to provide bulky drivers which are required only to support testing.

Referring again to FIG. 2, at step 612, additional testing of the electronic device 300 can occur. For example, as discussed above, in some embodiments, the probe card assembly 200 can include electrical connections 212 to probes (e.g. 204i) which connect the test interface 218 to terminals (e.g. 302i) of the device 300 to allow the tester 500 to provide signals to functional circuitry (not shown) of the electronic device 300. The tester 500 can also receive signals from functional circuitry of the device 300 via a similar mechanism.

If desired, in some embodiments the probe card assembly 200 can also include circuitry 220. For example, the circuitry 220 on the probe card assembly can also be used to provide test signals for input to the electronic device 300 (e.g. to terminals 304a), receive response signals output by the electronic device 300 (e.g., from a terminal 304b), and to control testing of the electronic device 300. Alternatively, the terminals 304a, 304b can be through-device vias. In general, any connection shown herein to be a through-device via 302 can alternatively be a terminal 304, or vice versa according to some embodiments of the invention.

At step 614 of FIG. 2, ones of the probes 204 can be connected to ground 207, which can be done, for example, as in step 604. At step 616, the contact between the probe card assembly 200 and the electronic device 300 effected at step 606 can be broken. For example, the electronic device 300 can be moved away from the probe card assembly 200. At step 618, the probes 204 can be disconnected from ground 207, for example, as discussed above with respect to step 608. While the probe card assembly 200 remains mounted in the test structure as performed at step 602, a new electronic device 300 can be tested by repeating steps 604-618. As noted, this can be done without removing the probe card assembly 200 from the test structure to which it was mounted at step 602.

The methods illustrated in FIGS. 2-4 are examples only, and variations and substitutions are possible and contemplated. For example, there can be additional steps in any of the methods 600, 700, and/or 800 in FIGS. 2-4. As another example, some of the steps in the methods illustrated in FIGS. 2-4 need not be included and thus need not be performed. For example, steps 604, 608, 614, and 618 need not be included in the method 600 of FIG. 2. As yet another example, at least some of the steps in FIGS. 2-4 can be performed in a different order than shown.

While a number of features have been described and illustrated herein, a probe card assembly 200 and electronic device 300 need not include every feature described. Accordingly, an embodiment of a probe card assembly 200 can include any combination of one or more of the presently disclosed features. Similarly, an embodiment of an electronic device 300 can include any combination of one or more of the presently disclosed features.

Although specific embodiments and applications of the invention have been described in this specification, these embodiments and applications are exemplary only, and many variations are possible.

I claim:

1. A method of testing an electronic device, wherein the electronic device comprises a plurality of through-device vias, the method comprising:

bringing electrically conductive probes of a probe card assembly into contact with a first electronic device and thereby making electrical connections between the probe card assembly and the first electronic device through the probes, wherein a set of the probes are electrically connected to each other within the probe card assembly and are brought into contact with a set of through-device vias of the first electronic device;
providing from within the first electronic device a test signal to a first one of the through-device vias in the set of the through-device vias of the first electronic device; and
determining whether the test signal is present on a second one of the through-device vias in the set of the through-device vias of the first electronic device.

2. The method of claim 1, wherein:
the set of the probes comprises a first pair of the probes electrically connected to each other by a first electrical connection in the probe card assembly and a second pair of the probes electrically connected to each other by a second electrical connection in the probe card assembly; and
the bringing effects electrical connections between:
a first probe of the probes of the first pair and the first through device via,
a second probe of the probes of the first pair and the second through device via,
a third probe of the probes of the second pair and a third one of the through-device vias in the set of the through device vias, and
a fourth probe of the probes of the second pair and a fourth one of the through-device vias in the set of the through device vias.

3. The method of claim 2, wherein:
the method further comprises electrically connecting within the probe card assembly the first pair of the probes to the second pair of the probes; and
the determining further comprises determining whether the test signal is present on the fourth through-device via.

4. The method of claim 2, wherein:
the method further comprises electrically connecting within the first electronic device the second through-device via and the third through-device via; and
the determining further comprises determining whether the test signal is present on the fourth through-device via.

5. The method of claim 1 further comprising
prior to said bringing, connecting within the probe card assembly the set of the probes to ground, and
after said bringing, disconnecting within the probe card assembly the set of the probes from ground.

6. The method of claim 1 further comprising:
prior to the bringing, coupling the probe card assembly to a testing structure;
after the bringing, the providing, and the determining with respect to the first electronic device, breaking the contact of the probe card assembly with the first electronic device; and
while the probe card assembly remains coupled to the testing structure:
bringing electrically conductive probes of the probe card assembly into contact with a second electronic device and thereby making electrical connections between the probe card assembly and the second electronic device through the probes, wherein the set of the probes electrically connected to each other within the probe card assembly are brought into contact with a set of through-device vias of the second electronic device;
providing from within the second electronic device a test signal to a first one of the through-device vias in the set of the through-device vias of the second electronic device; and
determining whether the test signal is present on a second one of the through-device vias in the set of the through-device vias of the second electronic device.

7. A probe card assembly comprising:
a substrate;
probes disposed on the substrate and arranged to contact connection structures including ends of through-device vias of an electronic device; and
a first electrical connection electrically connecting a first probe and a second probe in a first pair of the probes, wherein the first probe, the second probe, and the first electrical connection form a first direct return loop from a first one of the through-device vias to a second one of the through-device vias while the first probe is in contact with the first through-device via and the second probe is in contact with the second through-device via,
wherein the first direct return loop is the only direct electrical connection between the first through-device via and the second through-device via while the first probe is in contact with the first through-device via and the second probe is in contact with the second through-device via.

8. The probe card assembly of claim 7 further comprising a second electrical connection electrically connecting a third probe and a fourth probe in a second pair of the probes, wherein the third probe, the fourth probe, and the second electrical connection form a second direct return loop from a third one of the through-device vias to a fourth one of the device vias while the third probe is in contact with the third through-device via and the fourth probe is in contact with the fourth through-device via.

9. The probe card assembly of claim 8 further comprising a third electrical connection electrically connecting the first electrical connection and the second electrical connection.

10. The probe card assembly of claim 9, wherein the third electrical connection comprises a switch that selectively connects and disconnects the first electrical connection and the second electrical connection.

11. The probe card assembly of claim 8 further comprising an electrical interface to a tester configured to control testing of the electronic device.

12. The probe card assembly of claim 11, wherein the first electrical connection is not directly connected to the electrical interface.

13. The probe card assembly of claim 12, wherein the electrical interface is directly connected to ones of the probes.

14. The probe card assembly of claim 7 further comprising a switch that selectively connects and disconnects the first electrical connection to and from ground.

15. The probe card assembly of claim 7, wherein the substrate is rigid and the probes are elongate, flexible, and resilient.

16. An electronic device comprising:
a semiconductor substrate;
through-device vias passing through the semiconductor substrate from one side of the semiconductor substrate to an opposite side;
a driver circuit coupled to a first one of the through-device vias;
a first receiver circuit coupled to a second one of the through-device vias;
a test circuit coupled to the driver circuit and the first receiver circuit, the test circuit configured to cause the driver circuit to drive a test signal onto the first through-device via and determine whether the test signal is received at the first receiver from the second through-device via, wherein the driver circuit, the first receiver circuit, and the test circuit are part of the semiconductor substrate.

17. The electronic device of claim 16 further comprising a second receiver circuit coupled to a third one of the through-device vias,
 wherein the test circuit is further coupled to the second receiver circuit, and the test circuit is further configured to determine whether the test signal is received at the second receiver from the third through-device via.

18. The electronic device of claim 17 further comprising a switch that selectively connects and disconnects the second through-device via and a fourth through-device via.

19. The electronic device of claim 16 further comprising a contact structure on the one side of the semiconductor substrate electrically connected to the test circuit.

20. The method of claim 1, wherein:
 the set of probes comprises a first pair of two of the probes that are directly connected electrically to each other within the probe card assembly,
 the set of through-device vias comprises a first pair of two of the through-device vias,
 the bringing comprises bringing the first pair of probes into contact with the first pair of through-device vias, and
 the first pair of probes is the only direct electrical connection between the two through-device vias of the first pair of through-device vias.

21. The method of claim 20, wherein the first electronic device is a semiconductor die, and the through-device vias extend from one side of the semiconductor die to an opposite side of the semiconductor die.

22. The method of claim 20, wherein:
 the bringing comprises bringing the electrically conductive probes of the probe card assembly into contact with the first electronic device while the probes are connected to ground, and
 the method further comprises disconnecting the probes from ground while the probes are in contact with the first electronic device and before the providing.

23. The electronic device of claim 16, wherein the driver circuit, the receiver circuit, and the test circuit are integrated circuits in the semiconductor substrate.

* * * * *